US006765827B1

United States Patent
Li et al.

(10) Patent No.: US 6,765,827 B1
(45) Date of Patent: Jul. 20, 2004

(54) METHOD AND SYSTEM FOR DETECTING DEFECTIVE MATERIAL SURROUNDING FLASH MEMORY CELLS

(75) Inventors: Jiang Li, San Jose, CA (US); Lee Cleveland, Santa Clara, CA (US); Ming Kwan, San Leandro, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/384,936

(22) Filed: Mar. 10, 2003

(51) Int. Cl.[7] .............................................. G11C 16/06

(52) U.S. Cl. .................... 365/185.09; 365/200; 365/201

(58) Field of Search ........................... 365/185.09, 200, 365/201, 185.33, 189.09

(56) References Cited

U.S. PATENT DOCUMENTS 6,370,070 B1 * 4/2002 Chevallier et al. .......... 365/201

* cited by examiner

Primary Examiner—David Lam
(74) Attorney, Agent, or Firm—Monica H. Choi

(57) ABSTRACT

In a method and system for detecting defective material surrounding a flash memory cell, stressing voltage is applied between a control gate and a well of the flash memory cell. A stress recovery process is then performed on the flash memory cell. Any short circuit, formed through the material between the control gate and at least one of drain and source bit line junctions of the flash memory cell, is detected. The material surrounding the flash memory cell may be an inter-level dielectric material. The present invention may be applied to an array of flash memory cells comprising a flash memory device during testing of the flash memory device before being shipped to the customer.

18 Claims, 7 Drawing Sheets

METHOD AND SYSTEM FOR DETECTING DEFECTIVE MATERIAL SURROUNDING FLASH MEMORY CELLS

TECHNICAL FIELD

The present invention relates generally to flash memory devices, and more particularly, to a method and system for detecting defective material surrounding flash memory cells of a flash memory device.

BACKGROUND OF THE INVENTION

Referring to FIG. 1, a flash memory cell 100 of a flash memory device includes a tunnel dielectric structure 102 typically comprised of silicon dioxide ($SiO_2$) or nitrided oxide as known to one of ordinary skill in the art of integrated circuit fabrication. The tunnel dielectric structure 102 is disposed on a P-well 103 formed within a semiconductor substrate 105. In addition, a floating gate structure 104, comprised of a conductive material such as polysilicon for example, is disposed over the tunnel dielectric structure 102.

In addition, a floating dielectric structure 106, typically comprised of silicon dioxide ($SiO_2$), is disposed over the floating gate structure 104. A control gate structure 108, comprised of a conductive material, is disposed over the dielectric structure 106. The tunnel dielectric structure 102, the floating gate structure 104, the floating dielectric structure 106, and the control gate structure 108 form a gate stack of the flash memory cell 100.

A drain bit line junction 110 is formed toward the left of the gate stack of the flash memory cell 100 within an active device area of the P-well 103 defined by STI (shallow trench isolation) structures 107. Similarly, a source bit line junction 114 is formed toward the right of the gate stack of the flash memory cell 100 within the active area of the P-well 103. When the P-well 103 is doped with a P-type dopant, the drain and source bit line junctions 110 and 114 are doped with an N-type dopant, such as arsenic (As) or phosphorous (P) for example, for forming an N-channel flash memory cell 100. Such a structure of the flash memory cell 100 is known to one of ordinary skill in the art of flash memory technology.

During the program or erase operations of the flash memory cell 100 of FIG. 1, charge carriers are injected into or tunneled out of the floating gate structure 104. Such variation of the amount of charge carriers within the floating gate structure 104 alters the threshold voltage of the flash memory cell 100, as known to one of ordinary skill in the art of flash memory technology. For example, when electrons are the charge carriers that are injected into the floating gate structure 104, the threshold voltage increases. Alternatively, when electrons are the charge carriers that are tunneled out of the floating gate structure 104, the threshold voltage decreases. These two conditions are used as the two states for storing digital information within the flash memory cell 100, as known to one of ordinary skill in the art of electronics.

FIG. 2 illustrates a circuit diagram representation of the flash memory cell 100 of FIG. 1 including a control gate terminal 150 coupled to the control gate structure 108, a drain terminal 152 coupled to the drain bit line junction 110, a source terminal 154 coupled to the source bit line junction 114, and a P-well terminal 156 coupled to the P-well 103. FIG. 3 illustrates a flash memory device 200 comprised of an array of flash memory cells, as known to one of ordinary skill in the art of flash memory technology. Referring to FIG. 3, the array of flash memory cells 200 includes rows and columns of flash memory cells with each flash memory cell having similar structure to the flash memory cell 100 of FIGS. 1 and 2. The array of flash memory cells 200 of FIG. 3 is illustrated with 2 columns and 2 rows of flash memory cells for simplicity and clarity of illustration. However, a typical array of flash memory cells comprising an electrically erasable and programmable memory device has more numerous rows and columns of flash memory cells.

Further referring to FIG. 3, in the array of flash memory cells 200 comprising an flash memory device, the control gate terminals of all flash memory cells in a row of the array are coupled together to form a respective word line for that row. In FIG. 3, the control gate terminals of all flash memory cells in the first row are coupled together to form a first word line 202, and the control gate terminals of all flash memory cells in the second row are coupled together to form a second word line 204.

In addition, the drain terminals of all flash memory cells in a column are coupled together to form a respective bit line for that column. In FIG. 3, the drain terminals of all flash memory cells in the first column are coupled together to form a first bit line 206, and the drain terminals of all flash memory cells in the second column are coupled together to form a second bit line 208. Further referring to FIG. 3, the source terminal of all flash memory cells of the array 200 are coupled together to a source voltage $V_{SS}$, and the P-well terminal of all flash memory cells of the array 200 are coupled together to a substrate voltage $V_{SUB}$ during some modes of operation of the flash memory cell. Such a circuit of the array of flash memory cells comprising the flash memory device 200 is known to one of ordinary skill in the art of flash memory technology.

Referring to FIG. 4, an inter-level dielectric material 120 surrounds the gate stack of the flash memory cell 100. The inter-level dielectric material 120 may be comprised of silicon dioxide ($SiO_2$) or a low-k dielectric material having a dielectric constant lower than that of silicon dioxide ($SiO_2$). Such an inter-level dielectric material 120 is known to one of ordinary skill in the art of integrated circuit fabrication.

Further referring to FIG. 4, during operation of the flash memory cell 100 within a flash memory device 200, a high voltage difference, such as a voltage difference of about 15 Volts for example, may be repeatedly applied between the control gate 108 and the drain or source bit line junctions 110 and 114. If the inter-level dielectric material 120 is defective, such repeated application of the high voltage difference between the control gate 108 and the drain or source bit line junctions 110 and 114 may result in break-down of the inter-level dielectric material 120. With such break-down of the inter-level dielectric material 120, a short-circuit may be formed through the inter-level dielectric material 120 between the control gate 108 and the drain or source bit line junctions 110 and 114 (as illustrated by the dashed line 122 in FIG. 4).

Such a short-circuit between the control gate 108 and the drain or source bit line junctions 110 and 114 renders the flash memory cell 100 and thus the flash memory device 200 having the flash memory cell 100 inoperative. Thus, a mechanism is desired for detecting for defective dielectric material surrounding the flash memory cells of a flash memory device.

SUMMARY OF THE INVENTION

Accordingly, in a general aspect of the present invention, a stressing voltage is applied between the control gate and a well of the flash memory cell during testing for breaking down any defective dielectric material surrounding the flash memory cell such that the defective dielectric material may be detected during testing.

In one embodiment of the present invention, in a method and system for detecting defective material surrounding a flash memory cell, a stressing voltage is applied between a control gate and a well of the flash memory cell. A stress recovery process is then performed on the flash memory cell. Any short circuit, formed through the defective material between the control gate and at least one of drain and source bit line junctions of the flash memory cell, is detected.

In one embodiment of the present invention, the material surrounding the flash memory cell is an inter-level dielectric material. In another embodiment of the present invention, the flash memory cell is an N-channel flash memory cell. In that case, the stressing voltage includes a negative voltage applied on the control gate and a positive voltage applied on a P-well of the N-channel flash memory cell with the drain and source bit line junctions of the flash memory cell floating.

In a further embodiment of the present invention, the stress recovery process includes the step of applying ultra-violet light on the flash memory cell. Detection of the short circuit between the control gate and at least one of the drain and source bit line junctions may be performed by one of detecting a voltage drop of a forward biased diode between the control gate and the drain or source bit line junction of the flash memory cell; detecting a current level higher than a threshold current level between the control gate and the drain or source bit line junction of the flash memory cell; or detecting a resistance level lower than a threshold resistance level between the control gate and the drain or source bit line junction of the flash memory cell.

Such detection may be performed during wafer sort testing of the flash memory device having an array of flash memory cells. Thus, the present invention may be applied to an array of flash memory cells comprising a flash memory device during testing of the flash memory device. In this manner, defective dielectric material surrounding flash memory cells of a flash memory device are detected during testing of the flash memory device before being shipped to the customer.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, and 12 refer to elements having similar structure and function.

DETAILED DESCRIPTION

Figure 5:
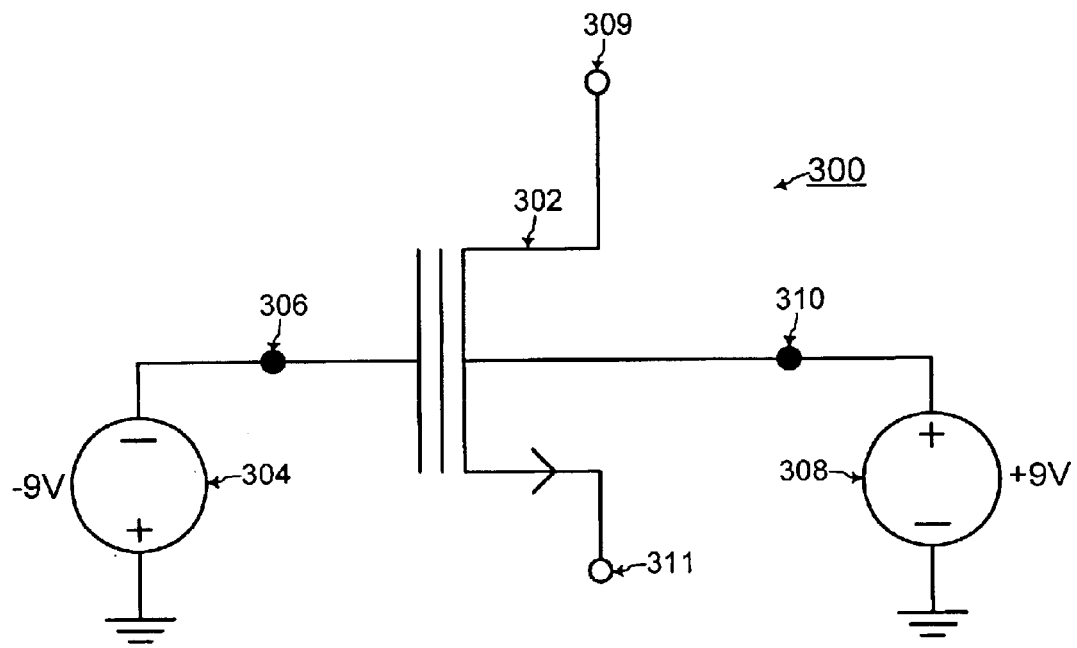
FIG. 5 illustrates application of a stressing voltage between the control gate and the P-well of a flash memory cell for breaking down any defective dielectric material surrounding the flash memory cell, according to an embodiment of the present invention.

Referring to FIG. 5, a system 300 for detecting defective dielectric material surrounding a flash memory cell 302 includes a first voltage source 304 coupled to a control gate terminal 306 of the flash memory cell 302 and a second voltage source 308 coupled to a well 310 of the flash memory cell 302. In addition, a drain bit line terminal 309 and a source bit line terminal 311 are left floating in FIG. 5.

Figure 1:
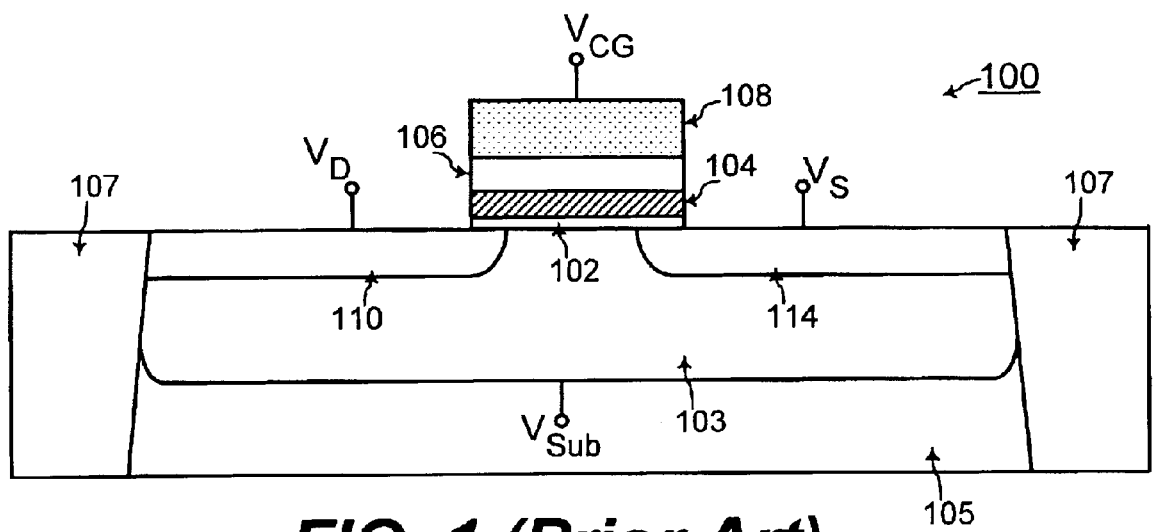
FIG. 1 shows a cross-sectional view of a flash memory cell, according to the prior art.
Figure 2:
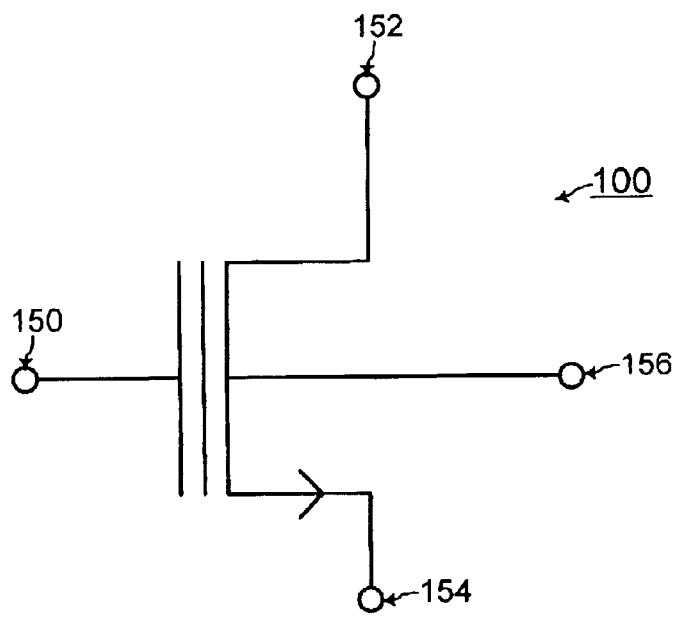
FIG. 2 shows a circuit diagram representation of the flash memory cell of FIG. 1, according to the prior art.
Figure 6:
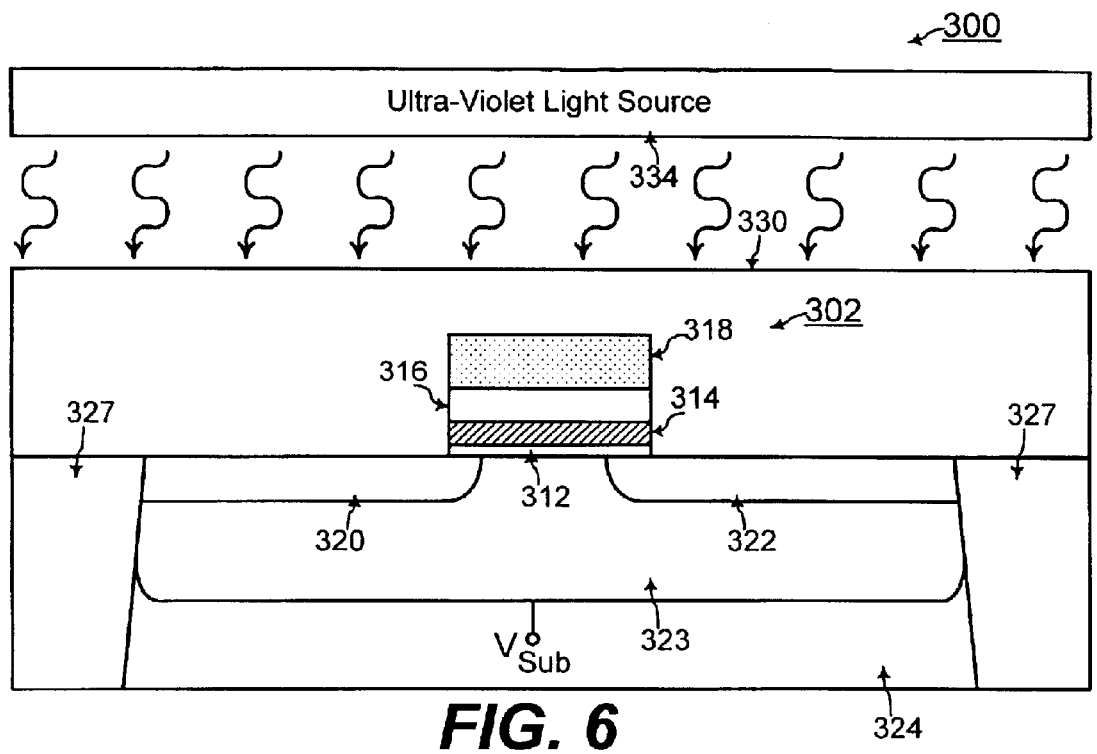
FIG. 6 illustrates a stress recovery process with application of ultra-violet light after application of the stressing voltage on the flash memory cell, according to an embodiment of the present invention.

Referring to FIG. 6, the cross-sectional view of the flash memory cell 302 includes a tunnel dielectric structure 312, a floating gate structure 314, a floating dielectric structure 316, and a control gate structure 318, similar to the structures 102, 104, 106, and 108 of FIG. 1. In addition, the flash memory cell 302 includes a drain bit line junction 320 and a source bit line junction 322 formed in a P-well 323, similar to the drain and source bit line junctions 110 and 114 of FIG. 1. The P-well 323 is formed within the semiconductor substrate 324 and is surrounded by STI (shallow trench isolation) structures 327, similar to the P-well 103 of FIG. 1.

Figure 4:
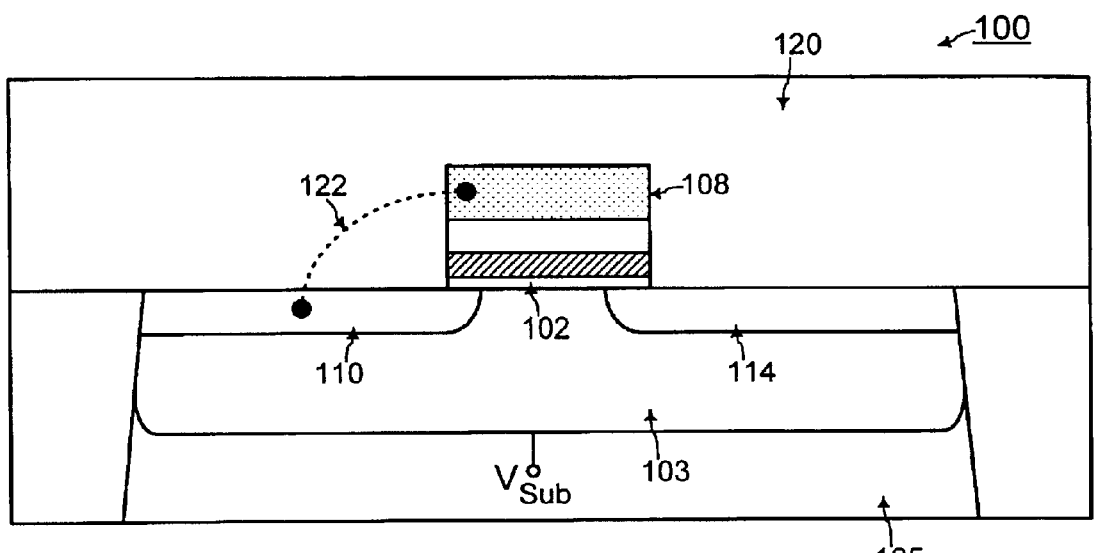
FIG. 4 shows the cross-sectional view of the flash memory cell of FIG. 1 with a short circuit through a defective dielectric material between the control gate and the drain bit line junction.

In addition, an inter-level dielectric material 330 surrounds the gate stack structures 312, 314, 316, and 318 and the drain and source drain bit line junctions 320 and 322 of the flash memory cell 302, similar to the inter-level dielectric material 120 of FIG. 4. Referring to FIGS. 5 and 6, the drain bit line terminal 309 is coupled to the drain bit line junction 320, the source bit line terminal 311 is coupled to the source bit line junction 322, the control gate terminal 306 is coupled to the control gate structure 318, and the P-well terminal 310 is coupled to the P-well 323.

Referring to FIGS. 5 and 6, a stressing voltage is applied across the control gate 318 and the P-well 323 of the flash memory cell 302 with the first and second voltage sources 304 and 308. In an example embodiment of the present invention, −9 Volts is applied on the control gate terminal 306 from the first voltage source 304, and +9 Volts is applied on the P-well terminal 310 from the second voltage source 308. Thus, a voltage difference of 18 Volts is applied between the control gate 318 and the P-well 323 of the flash memory cell 302.

Such a voltage difference across the control gate 318 and the P-well 323 is applied for a predetermined time period such as 100 milli-seconds for example. Alternatively, such a voltage difference across the control gate 318 and the P-well 323 is applied as a predetermined number of periodic pulses with an amplitude of −9 Volts and +9 Volts from the first and second voltage sources 304 and 308, respectively. Voltage sources for generating such voltages or such voltage pulses are individually known to one of ordinary skill in the art of electronics.

Further referring to FIGS. 5 and 6, as such a voltage difference is applied across the control gate 318 and the P-well 323 of the flash memory cell 302, the drain and source bit line junctions 320 and 322 are left floating. With such a relatively large voltage difference applied across the control gate 318 and the P-well 323, if the dielectric material 330 is defectively prone to break down, the dielectric material 330 breaks down and may create a short circuit between the control gate 318 and at least one of the drain and source bit line junctions 320 and 322 (similar to the short circuit 122 of FIG. 4).

Referring to FIG. 6, the system 300 of an embodiment of the present invention includes an ultra-violet light source 334 that applies an ultra-violet light on the flash memory cell 302. The bias configuration of FIG. 5 is similar to a bias configuration for a channel erase process of the flash memory cell 302. Thus, negative charge carriers are stored within the floating gate 314 (i.e., the flash memory cell is in an erased state) from the stressing voltage applied across the control gate 318 and the P-well 323 in the bias configuration of FIG. 5.

In FIG. 6, a stress recovery process is performed by applying ultra-violet light from the ultra-violet light source 334 on the flash memory cell 302. The ultra-violet light that is applied for a predetermined time period causes the negative charge carriers stored within the floating gate 314 to be returned to the P-well 323 to restore the flash memory cell 302 to an equilibrium state of not being erased. Use of ultra-violet light in general is individually known to one of ordinary skill in the art of flash memory technology.

Figure 7:
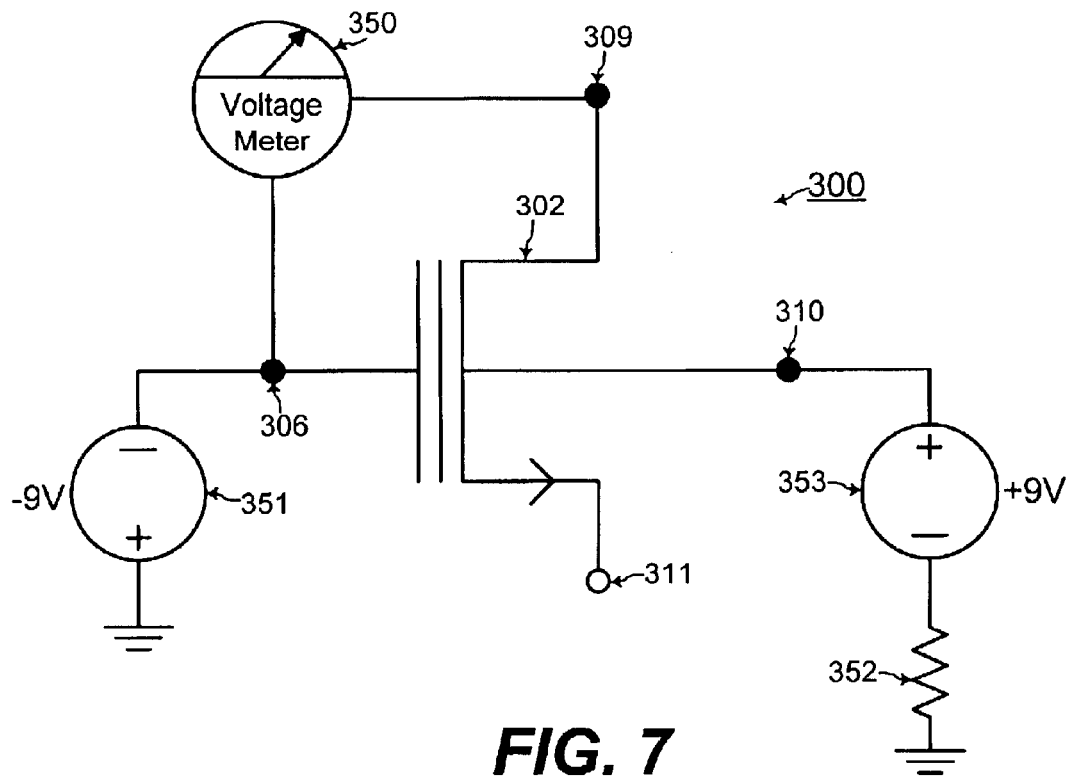
FIG. 7 illustrates detection of any short circuit through the dielectric material between the control gate and the drain bit line junction of the flash memory cell using a voltage meter coupled between the control gate and the drain bit line junction, according to an embodiment of the present invention.

After the stress recovery process of FIG. 6, the system 300 of the present invention includes a wafer sort testing process that is performed for detecting any short circuit through the dielectric material 330 between the control gate 318 and one of the drain and source bit line junctions 320 and 322. Referring to FIG. 7, during such a testing process, a testing voltage is applied across the control gate 318 and the P-well 323 from first and second test voltage sources 351 and 353, respectively. For example, a test voltage of −9 Volts from the first test voltage source 351 is applied on the control gate terminal 306, and a test voltage of +9 Volts from the second test voltage source 353 is applied on the P-well terminal 310.

Further referring to FIG. 7, a voltage meter 350 is coupled between the control gate 318 and the drain bit line junction 320 of the flash memory cell 302 for detecting a short circuit through the dielectric material 330 between the control gate 318 and the drain bit line junction 320. When the test voltages of −9 Volts and +9 Volts are applied across the control gate 318 and the P-well 323, if a short-circuit exists through the dielectric material 330 between the control gate 318 and the drain bit line junction 320, then −9 Volts becomes applied on the drain bit line junction 320.

−9 Volts applied on the N-type drain bit line junction 320 and +9 Volts applied on the P-well 323 results in a forward-biased diode through the drain bit line junction 320 and the P-well 323. Thus, the voltage meter 350 detects the voltage drop of a forward biased diode (i.e., approximately 0.7 Volts) across the drain bit line junction 320 and the P-well 323. A resistor 352 in FIG. 7 represents the Thevinin equivalent resistance in the path of the forward biased diode, and a remaining voltage drop of the test voltages from the first and second test voltage sources 351 and 353 develops across such a resistance 352. In this manner, detection of a voltage drop of a forward biased diode by the voltage meter 350 indicates the presence of a short-circuit through the dielectric material 330 between the control gate 318 and the drain bit line junction 320.

Figure 8:
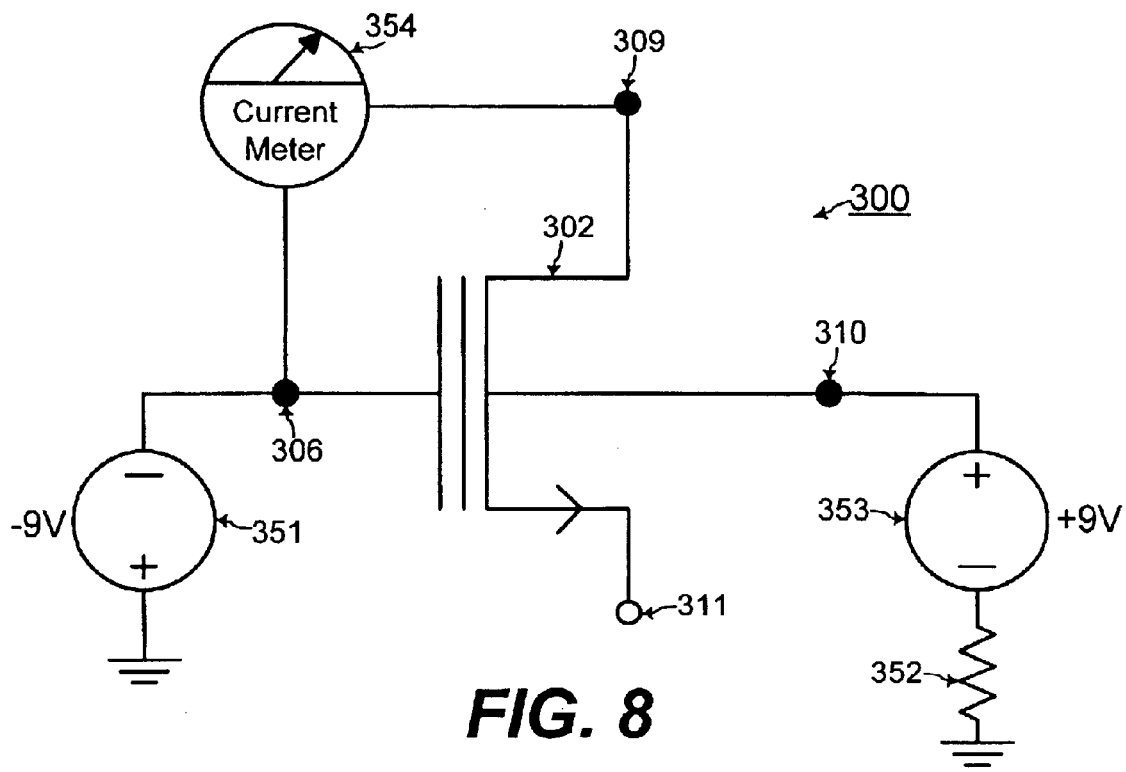
FIG. 8 illustrates detection of any short circuit through the dielectric material between the control gate and the drain bit line junction of the flash memory cell using a current meter coupled between the control gate and the drain bit line junction, according to an embodiment of the present invention.

Alternatively, referring to FIG. 8, a current meter 354, instead of the voltage meter 350, is coupled between the control gate 318 and the drain bit line junction 320. When the test voltages of −9 Volts and +9 Volts are applied across the control gate 318 and the P-well 323, if a short-circuit exists through the dielectric material 330 between the control gate 318 and the drain bit line junction 320, the current meter 354 measures a level of current flowing between the control gate 318 and the drain bit line junction 320 that is greater than a threshold current level. On the other hand, if no short-circuit exists through the dielectric material 330 between the control gate 318 and the drain bit line junction 320, the current meter 354 would measure substantially zero current between the control gate 318 and the drain bit line junction 320.

Figure 9:
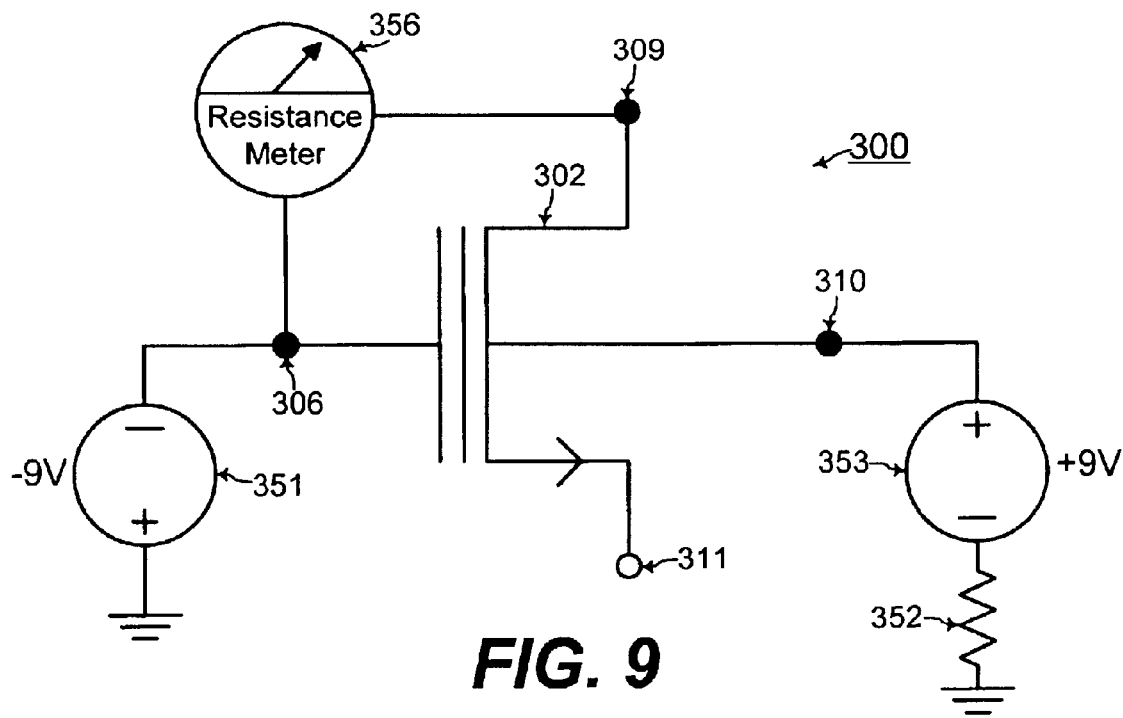
FIG. 9 illustrates detection of any short circuit through the dielectric material between the control gate and the drain bit line junction of the flash memory cell using a resistance meter coupled between the control gate and the drain bit line junction, according to an embodiment of the present invention.

Also, referring to FIG. 9, a resistance meter 356 is coupled between the control gate 318 and the drain bit line junction 320 for detecting a short-circuit there-between. When the test voltages of −9 Volts and +9 Volts are applied across the control gate 318 and the P-well 323, if a short-circuit exists through the dielectric material 330 between the control gate 318 and the drain bit line junction 320, the resistance meter 356 measures a level of resistance between the control gate 318 and the drain bit line junction 320 that is lower than a threshold resistance level. On the other hand, if no short-circuit exists through the dielectric material 330 between the control gate 318 and the drain bit line junction 320, the resistance meter 356 would measure a substantially large resistance (i.e., an open circuit) between the control gate 318 and the drain bit line junction 320.

Figure 10:
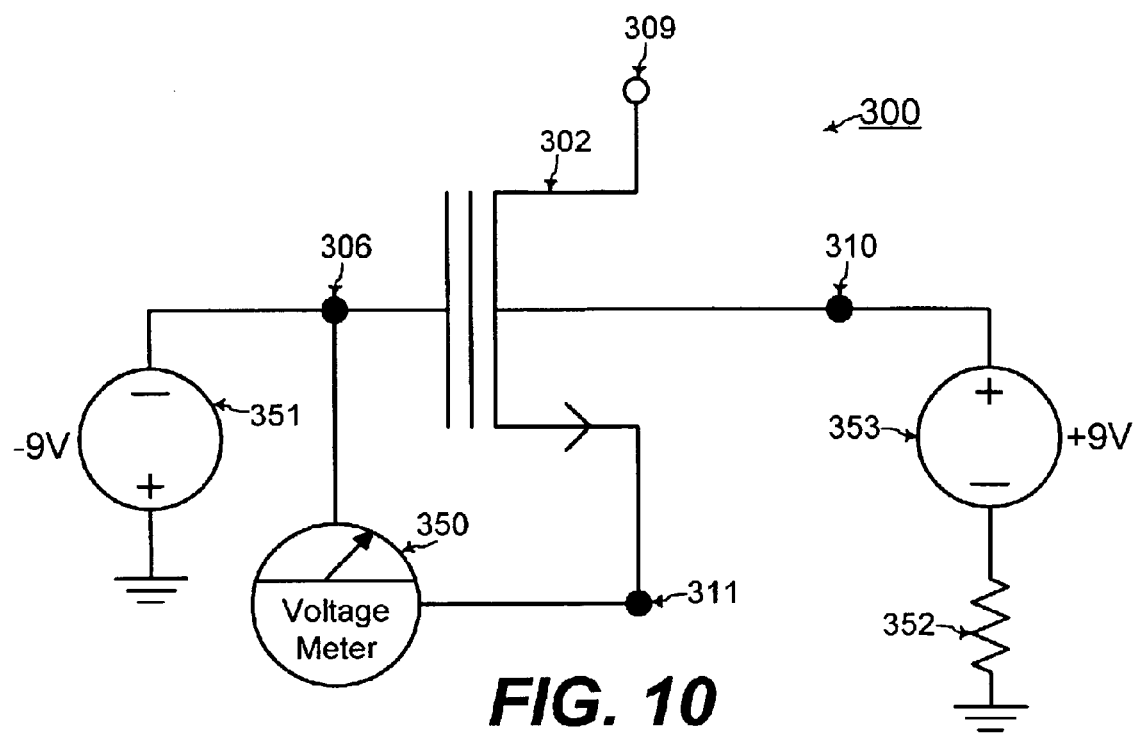
FIG. 10 illustrates detection of any short circuit through the dielectric material between the control gate and the source bit line junction of the flash memory cell using a voltage meter coupled between the control gate and the source bit line junction, according to an embodiment of the present invention.

Referring to FIG. 10, the voltage meter 350 is coupled between the control gate 318 and the source bit line junction 322 for detecting a short-circuit there-between through the dielectric material 330. When the test voltages of −9 Volts and +9 Volts are applied across the control gate 318 and the P-well 323, if a short-circuit exists through the dielectric material 330 between the control gate 318 and the source bit line junction 322, the voltage meter 350 would detect the voltage drop of a forward biased diode (i.e., approximately 0.7 Volts) across the source bit line junction 322 and the P-well 323.

Figure 11:
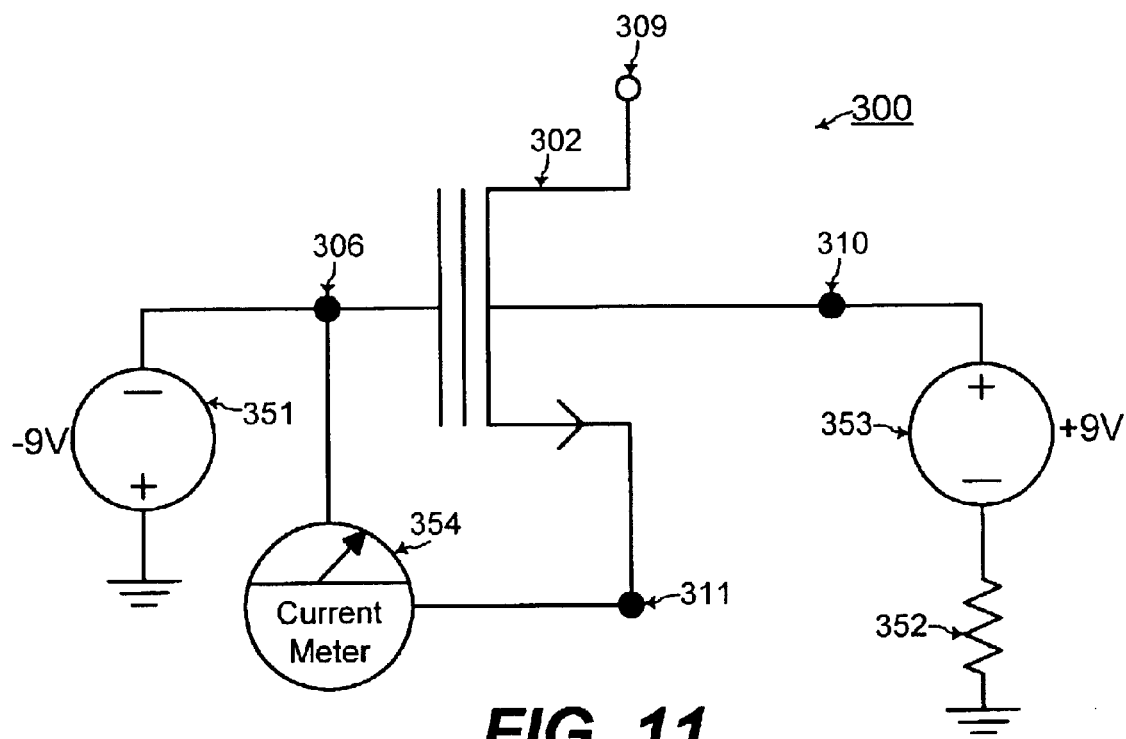
FIG. 11 illustrates detection of any short circuit through the dielectric material between the control gate and the source bit line junction of the flash memory cell using a current meter coupled between the control gate and the source bit line junction, according to an embodiment of the present invention.

Referring to FIG. 11, the current meter 354 is coupled between the control gate 318 and the source bit line junction 322 for detecting a short-circuit there-between through the dielectric material 330. When the test voltages of −9 Volts and +9 Volts are applied across the control gate 318 and the P-well 323, if a short-circuit exists through the dielectric material 330 between the control gate 318 and the source bit line junction 322, the current meter 354 measures a level of current flowing between the control gate 318 and the source bit line junction 322 that is greater than the threshold current level.

Figure 12:
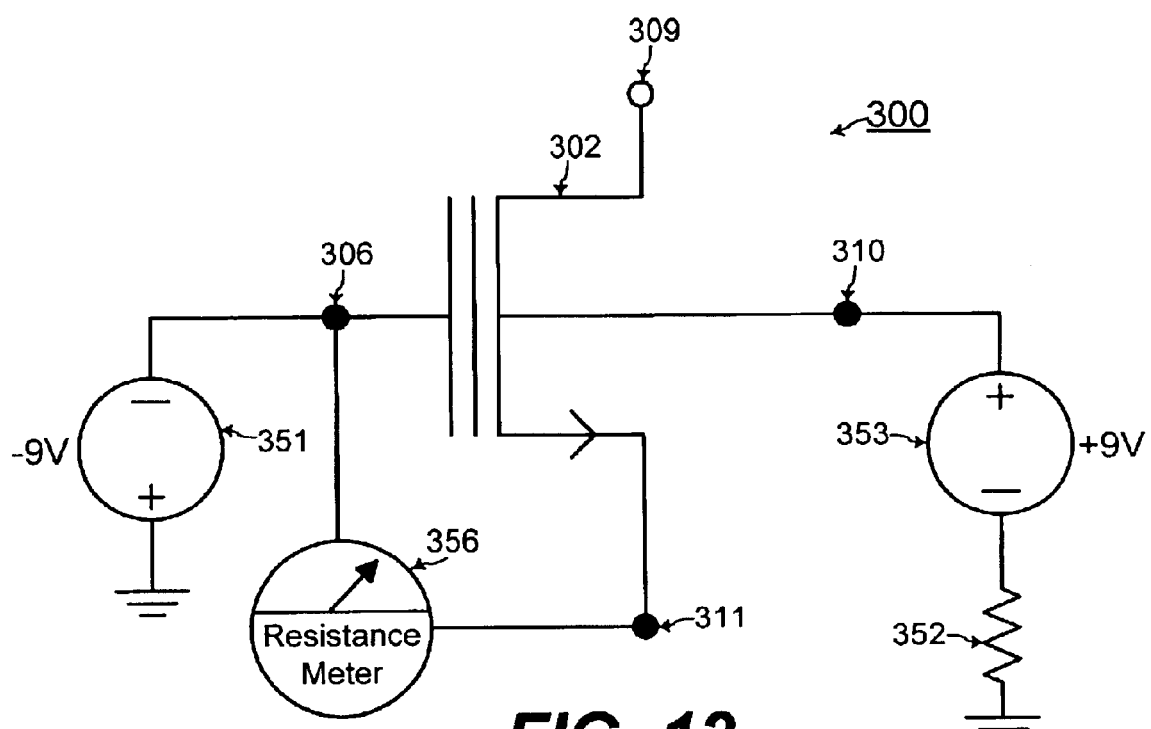
FIG. 12 illustrates detection of any short circuit through the dielectric material between the control gate and the source bit line junction of the flash memory cell using a resistance meter coupled between the control gate and the source bit line junction, according to an embodiment of the present invention.

Referring to FIG. 12, the resistance meter 356 is coupled between the control gate 318 and the source bit line junction 322 for detecting a short-circuit there-between through the dielectric material 330. When the test voltages of −9 Volts and +9 Volts are applied across the control gate 318 and the P-well 323, if a short-circuit exists through the dielectric material 330 between the control gate 318 and the source bit line junction 322, the resistance meter 354 measures a level of resistance between the control gate 318 and the source bit line junction 322 that is lower than the threshold resistance level.

Figure 3:
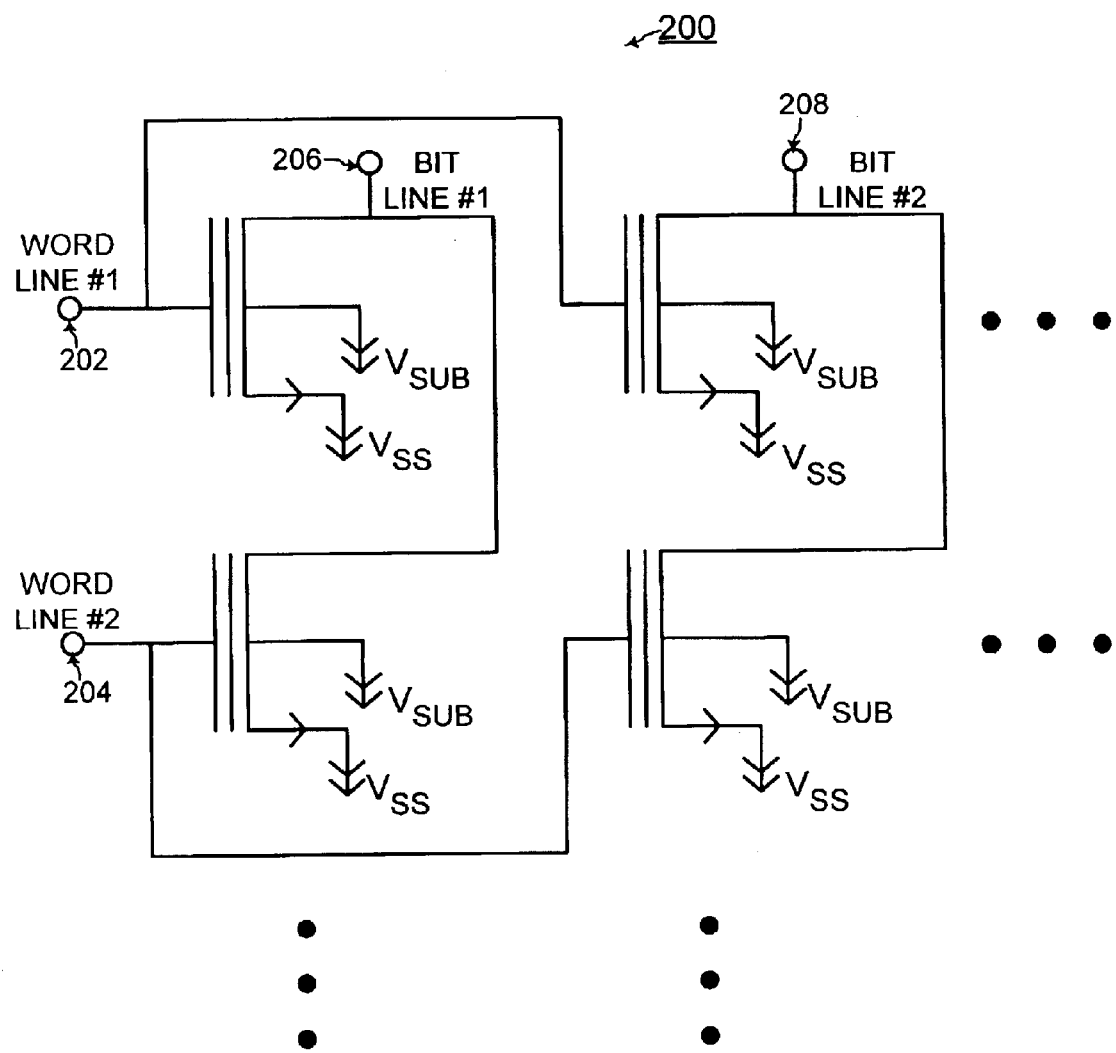
FIG. 3 shows an array of flash memory cells comprising a flash memory device, according to the prior art.

Such measure of the voltage, current, or resistance between the control gate 318 and the drain or source bit line junctions 320 or 322 in FIG. 7, 8, 9, 10, 11, or 12 may be performed during normal wafer sort testing of flash memory cells comprising a flash memory device. For example, the bias configuration of the testing voltages applied on the control gate 318 and the P-well 323 in FIG. 7, 8, 9, 10, 11, or 12 is similar for a channel erase bias. Referring to FIG. 3, the process and system of applying the stressing voltage, performing the stress recovery process, and detecting for any short circuit through the dielectric material surrounding the flash memory cell may be performed for the array of flash memory cells comprising a flash memory device during testing of the flash memory device.

The foregoing is by way of example only and is not intended to be limiting. The present invention is limited only as defined in the following claims and equivalents thereof.

We claim:

1. A method for detecting detective material surrounding a flash memory cell, including the steps of:
    applying a stressing voltage between a control gate and a well of the flash memory cell;
    recovering the flash memory cell back to a predetermined equilibrium state; and
    determining whether a short circuit exists through the material between the control gate and at least one of drain and source bit line junctions of the flash memory cell.

2. The method of claim 1, wherein the material surrounding the flash memory cell is a dielectric material.

3. The method of claim 1, wherein the flash memory cell is an N-channel flash memory cell, and wherein the step of applying the stressing voltage includes:
    applying a negative voltage on the control gate and a positive voltage on a P-well or the N-channel flash memory cell; and
    floating the drain and source bit line junctions.

4. The method of claim 3 including the steps of:
    applying approximately −9.0 Volts on the control gate and approximately +9.0 Volts on the P-well of the N-channel flash memory cell.

5. The method of claim 1, wherein the step of recovering the flash memory cell includes applying ultraviolet light on the flash memory cell.

6. The method of claim 1 wherein the step of determining whether a short circuit exists includes detecting for a voltage drop of a forward diode between the control gate and the drain or source bit line junction.

7. The method of claim 1, wherein the step of determining whether a short circuit exists includes detecting for a current level higher than a threshold current level between the control gate and the drain or source bit line junction.

8. The method of claim 1, wherein the step of determining whether a short circuit exists includes detecting for a resistance level lower than a threshold resistance level between the control gate and the drain or source hit line junction.

9. The method of claim 1 wherein the flash memory cell is part of an array of flash memory cells comprising a flash memory device.

10. A system for detecting defective material surrounding a flash memory cell, comprising:
    at least one voltage source for applying a stressing voltage between a control gate and a well of the flash memory cell;
    a recovery apparatus for recovering the flash memory cell back to a predetermined equilibrium state; and
    a test system for determining whether a short circuit exists through the material between the control gate and at least one of drain and source bit line junctions of the flash memory cell.

11. The system of claim 10, wherein the material surrounding the flash memory cell is a dielectric material.

12. The system of claim 10, wherein the flash memory cell is an N-channel flash memory cell, and wherein the stressing voltage includes a negative voltage applied on the control gate and a positive voltage applied on a P-well of the N-channel flash memory cell with the drain and source bit line junctions floating.

13. The system of claim 10, wherein the stressing voltage includes approximately −9.0 Volts applied on the control gate and approximately +9.0 Volts applied on the P-well of the N-channel flash memory cell.

14. The system of claim 10, wherein the recovery apparatus applies ultra-violet light on the flash memory cell.

15. The system of claim 10, wherein the test system includes a voltage meter for detecting a voltage drop of a forward biased diode between the control gate and the drain or source bit line junction.

16. The system of claim 10, wherein the test system includes a current meter for detecting a current level higher than a threshold current level between the control gate and the drain or source bit line junction.

17. The system of claim 10, wherein the test system includes a resistance meter for detecting a resistance level lower than a threshold resistance level between the control gate and the drain or source bit line junction.

18. The system of claim 10, wherein the flash memory cell is part of an array of flash memory cells comprising a flash memory device.

* * * * *